United States Patent [19]

Hartley

[11] Patent Number: 4,934,313

[45] Date of Patent: Jun. 19, 1990

[54] CONTROL OF UNIFORMITY OF GROWING ALLOY FILM

[75] Inventor: Richard H. Hartley, Seaview Downs, Australia

[73] Assignee: Commonwealth of Australia, Adelaide, Australia

[21] Appl. No.: 208,077

[22] Filed: Jun. 17, 1988

Related U.S. Application Data

[62] Division of Ser. No. 51,627, filed as PCT AU86/00221 on Aug. 6, 1986, published as WO87/00966 on Feb. 12, 1987, Pat. No. 4,770,895.

[30] Foreign Application Priority Data

Aug. 7, 1985 [AU] Australia .............................. PH1837

[51] Int. Cl.$^5$ ........................... G05D 5/03; B05C 3/00
[52] U.S. Cl. .................................... 118/665; 118/50.1; 118/620
[58] Field of Search ...................... 118/665, 688, 50.1, 118/620, 600, 722, 688, 50.1

[56] References Cited

U.S. PATENT DOCUMENTS

| 4,159,919 | 7/1979 | McFee | 148/175 |
| 4,311,725 | 1/1982 | Holland | 118/665 |
| 4,525,376 | 6/1985 | Edgerton | 427/10 |
| 4,624,726 | 11/1986 | Gee et al. | 118/50.1 |
| 4,694,777 | 9/1987 | Roche | 118/50.1 |

FOREIGN PATENT DOCUMENTS 55-160421 12/1980 Japan.
57-106115 7/1982 Japan.
58-119630 7/1983 Japan.
59-92998 5/1984 Japan.

Primary Examiner—Willard Hoag
Attorney, Agent, or Firm—Cushman, Darby & Cushman

[57] ABSTRACT

Apparatus for the control of growth of epitaxial alloy films onto a substrate. A uniformity measurement probe scans the growing film and controls a corrector gun directing a corrector beam to the film. The probe and gun are correlated to determine the relevant characteristics of a point on the growing film and to apply a particular correction. Possible deposition alloys are cadmium, mercury and tellurium with the corrector beam being selected from one or more of these specie.

7 Claims, 5 Drawing Sheets

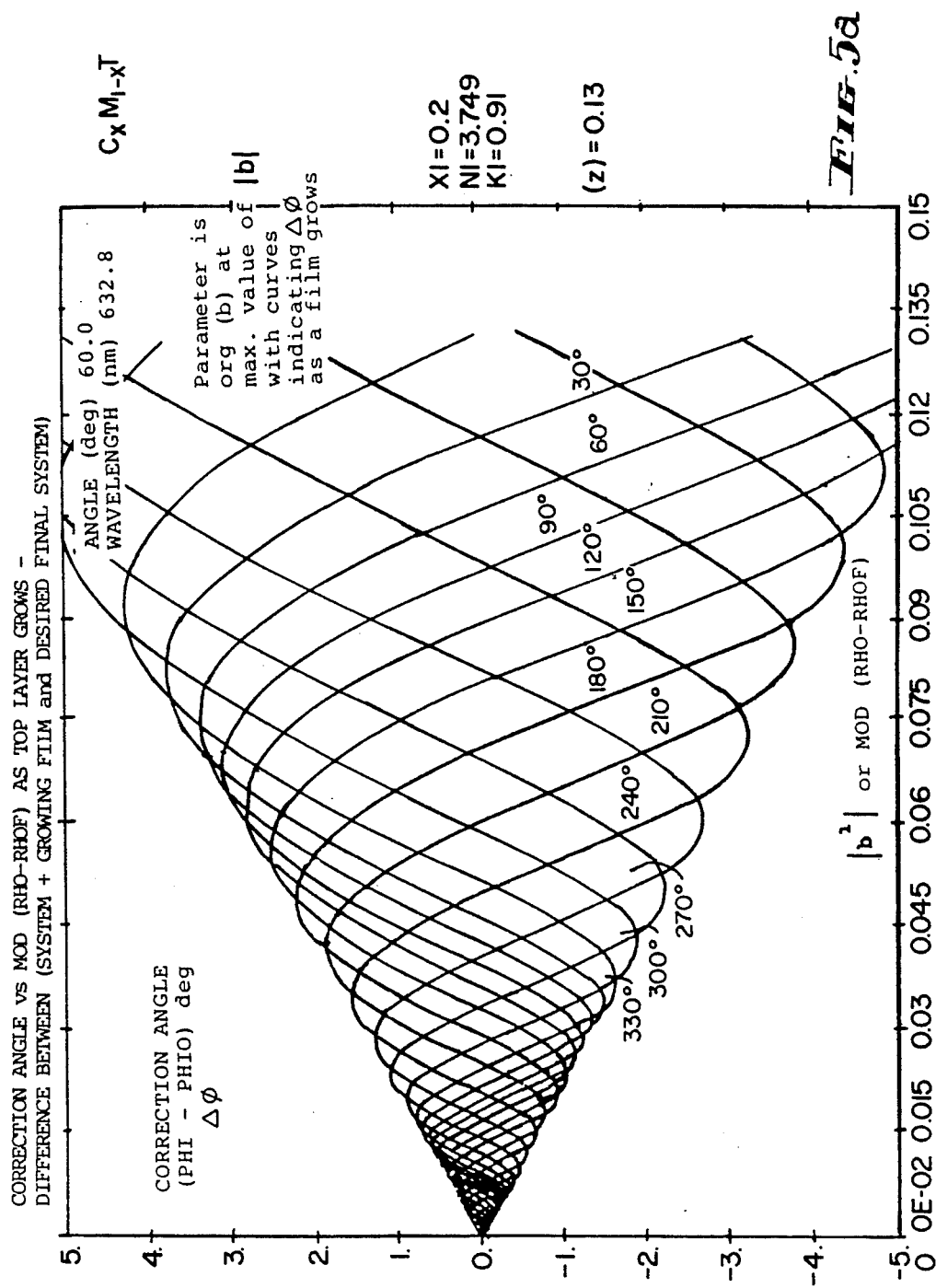

CONTROL OF UNIFORMITY OF GROWING ALLOY FILM

This is a division of application Ser. No. 07/051,627, filed as PCT Ah86/00221 on Aug. 6, 1986, published as WO87/00966 on Feb. 12, 1987, now patent No. 4,770,895.

This invention relates to a method of controlling uniformity of growing alloy film.

Low energy gap semiconducting material for use in infrared opto-electronic devices may be prepared in the form of thin uniform layers supported by suitable substrates. The substrate is selected because of its high degree of crystalline perfection and its suitability for epitaxial growth of the required film.

A variety of film growth methods are used for epitaxial growth, dependent somewhat on the materials involved. The alloy semiconducting compounds formed by materials such as cadmium, mercury and tellurium may be grown epitaxially on crystalline substrates in an ultra high vacuum by monitoring the growth with reflected high energy electron diffraction (RHEED).

Despite this sophisticated control the material composition and properties vary unacceptably over the area of the prepared layer and this lack of uniformity impedes the development of many opto-electronic devices.

It is the object of the present invention to provide a method of control and a method of production of the alloy film which will maintain the highest possible uniformity of the film.

The objects of the invention are achieved by use of a low energy ion beam or a series of ion beams impinging on the surface of the growing film, control of the ion beam or beams being by the utilization of information obtained by a uniformity probe or probes, based on ellipsometry and/or 2 photon reflectivity measurements, to both direct and/or control the beam or beams.

As an example of how the invention can be carried into effect, the accompanying drawing which forms part of this specification shows in diagramatic form how the ion beam or beams are controlled. At least one ion beam is scanned across the growing film. Control of the energy and intensity of all beams is determined by information obtained from the scanning reflectivity probe or probes and a computer may be used to evaluate algorithms and carry out the necessary adjustments in a closed loop manner.

The invention comprises at least one low energy molecular beam directed onto a substrate on which a film is to be grown, and is characterised by a uniformity measurement probe comprising a light source directed to the substrate on which the film is to be grown, and a detector to receive a signal from the light source reflected by the growing film, a corrector gum adapted to direct a corrector beam, onto the growing film, means to correlate at least the detector and the corrector beam to incrementally scan areas of the growing film, and computer means to control the said corrector beam from the signal received by the said detector.

The method consists in controlling the uniformity of a growing alloy film formed by directing at least one molecular beam onto a surface to grow a film on the surface while directing at least one uniformity measurement probe onto the growing film and incrementally scanning the surface with a detector forming part of the uniformity probe to produce a correction signal, and controlling the uniformity of the film being deposited by directing onto the area being scanned a corrector beam from a computer under control of the corrector signal.

The probe is conveniently an ellipsometry probe, but a 2 photon reflectivity probe can be used or both can be used simultaneously.

BRIEF DESCRIPTION OF THE DRAWINGS

In order to enable the invention to be fully understood, a preferred arrangement will be described with reference to the accompanying drawings in which:

FIGS. 5a and 5b show diagramatically a second order correction $\Delta\phi$ to the reference input $\phi$ for the case of growing a $Cd_xHg_{1-x}Te$ film with $x=0.2$ on a CdTe substrate. The correction $\Delta\phi$ is only needed if b is large.

Figure 1:
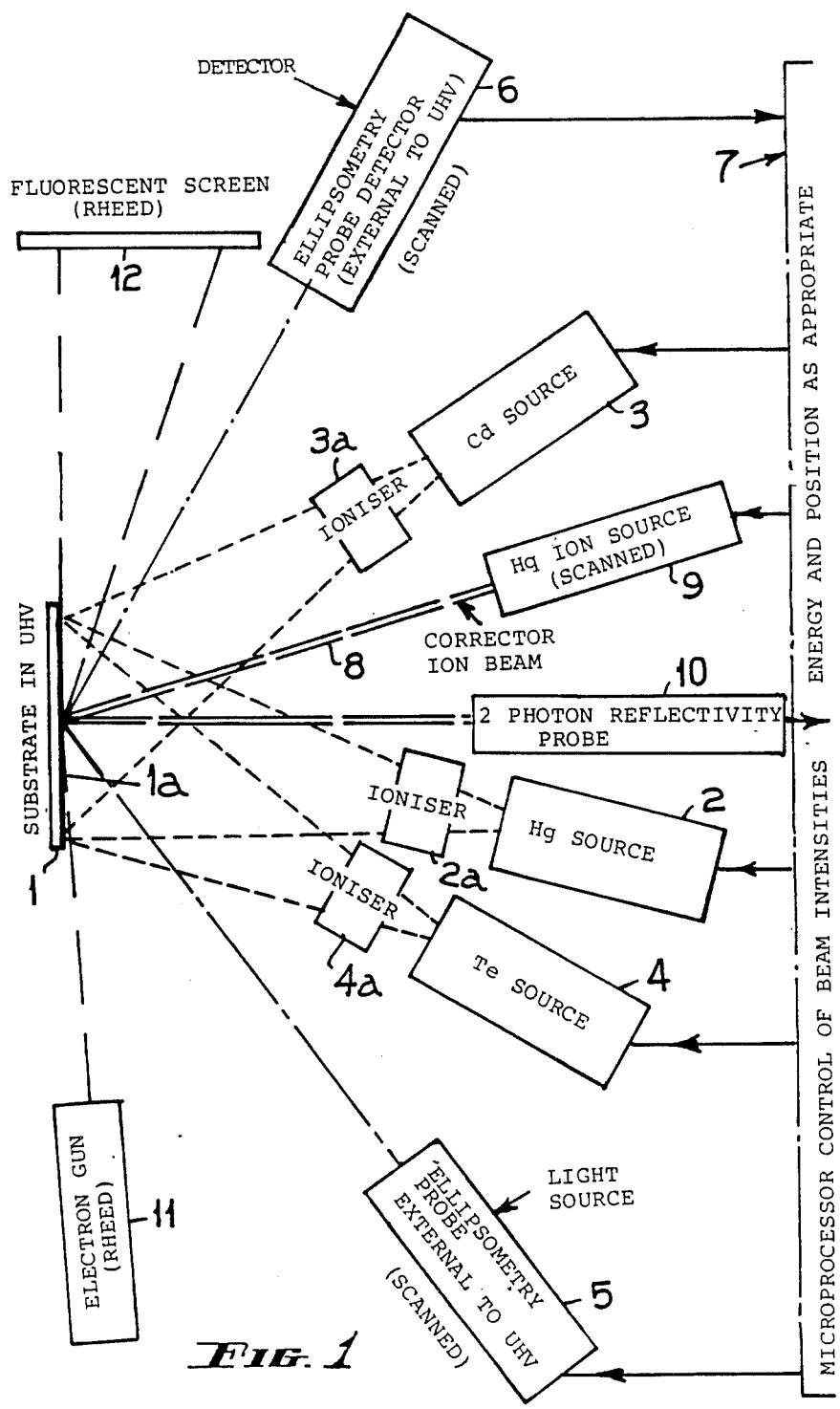
FIG. 1 is a schematic drawing showing three different molecular beam sources directed to a substrate on which a film is being grown and showing two uniformity probes, namely an ellipsometry probe and detector and a 2 photon reflectivity probe, including also a RHEED electron gun and fluorescent screen which however are not necessarily essential to the invention.

Referring first to FIG. 1 of the drawings, the substrate on which the alloy film is being grown is designated 1 and the deposition sources are indicated by 2, 3 and 4, in this case three molecular beams being used, the first of which has a mercury source, the second a cadmium source and the third a tellurium source, all of these sources being of usual or approved construction and directing the particular beam to the substrate 1. Optionally the molecular beams may be partially ionised by ionisers 2a, 3a, 4a placed along the path of each molecular beam.

The uniformity measurement probe 5-6 comprises the light source 5 and detector 6, and has the beam from the light source 5 directed to the surface of the substrate 1 and is arranged to illuminate the surface as required, and the output signal from the surface is received on the detector 6 which is arranged to scan the surface and the data from the detector is fed to the computer 7. The uniformity measurement probe 5-6 can synchronously scan the surface or the laser beam input to the measurement uniformity probe 5 can be beam expanded and a detector array 6 used.

Correction of the deposition on the substrate 1 is effected by means of a corrector beam 8 from an ion gun 9 which is arranged to scan the surface in a manner determined by the information obtained from the scanning beam from the uniformity measurement probe 5-6 if a scan mode is used, and this ion gun 9 is under control of the computer 7 through the signal received from the detector 6 to apply a corrector beam 8 to the substrate 1 surface.

The ellipsometry probe can be of the phase modulated type referred to in the paper by S. N. JASPERSON and S. E. SCHNATTERLY, Review of Scientific Instruments 40, 761, (1969) or any suitable ellipsometer probe.

The beams from the normal deposition sources 2, 3 and 4 are of relatively low energy, but the corrector beam 8 from the ion gun 9 is variable and is of a much higher energy capability when this is required, the invention operating on the basis that as deposition from the three deposition sources 2, 3 and 4 is taking place on the substrate 1a, or from any one of these, the uniformity measurement probe 5 constantly scans the surface and through the detector 6, operating through the computer 7, controls the corrector beam 8 to produce a uniform surface.

As stated earlier herein, the light source 5 can scan the alloy film on the substrate with similar scanning by the detector 6, or the light source 5 of the uniformity measurement probe can apply an expanded beam and an array of detectors can be used to obtain the information required to control the corrector beam 8 from the ion gun 9.

In the form shown in the illustration the corrector ion source 9 is from a mercury ion source, corresponding to the deposition source 2, but naturally this can have its source similar to the other two deposition sources 3 and 4. If required a plurality of corrector ion beam sources such as 8 can be used corresponding to some or each of the deposition ion sources 2, 3 or 4. Alternatively a corrector ion beam source such as 8 may use one or more of the inert gases Helium Neon or Argon to produce the ion beam.

As well as using the uniformity measurement probe 5-6, a 2 photon reflectivity probe 10 can be used for the purpose of determining electrical characteristics of the depositing film, such a probe being positioned to have a normal incidence to the substrate 1 and embodies a detector coupled to the computer 7.

Although not essential to the invention, an electron gun (RHEED) 11 is shown, the fluorescent screen of which is numbered 12.

Figure 2:
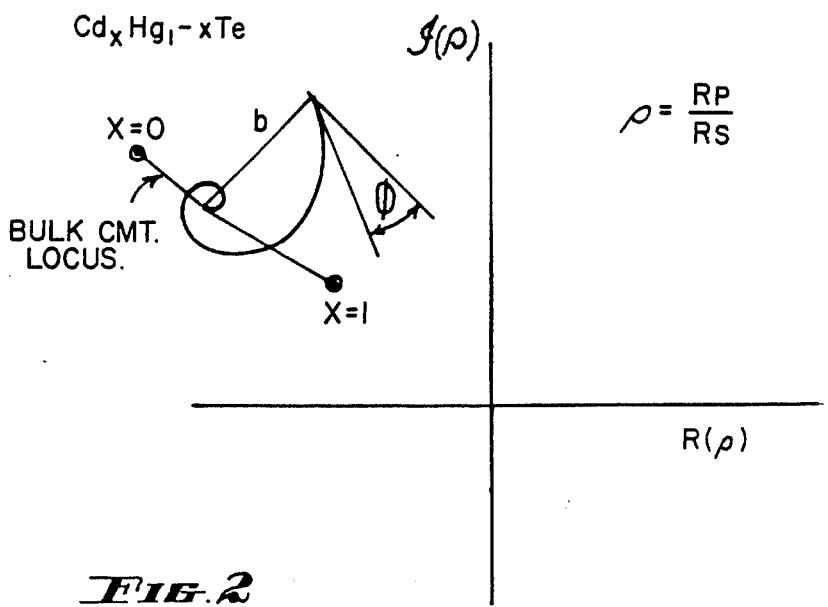
FIG. 2 is a schematic view showing basic ellipsometric data as used in the formula included later herein.
Figure 3:
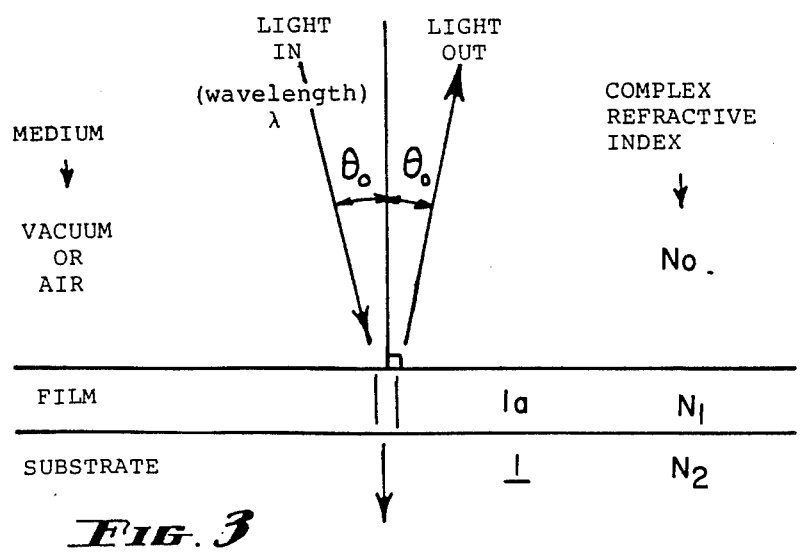
FIG. 3 is a diagram showing the relationship of the ellipsometry measurement beams in relation to the film being deposited on the substrate.

Referring now to FIGS. 2 and 3, which demonstrate by example, that when a high sensitivity ellipsometer is scanned across the growing film according to the systems described herein, a high degree of control of the film is achieved.

It will be seen that, using closed loop control to employ as reference input, the direction of travel of the locus of the ratio of complex reflectivities ($\rho$) can be used as a control as the film grows.

If the direction is measured with respect to the normal to the radius vector 'b' in FIG. 2 and called $\phi$ it may be taken in the first approximation as $$\phi = \arg\left[\frac{2\pi}{\lambda}(N_1^2 - N_0^2\cos^2\theta_0)^{\frac{1}{2}}\right] + \frac{\pi}{2}$$

To appreciate this reference may be had to FIG. 3 where the substrate 1 has on it a film 1a onto which the light from the uniformity measurement (ellipsometry) probe 5-6 is directed at angle $\theta_o$ and is reflected back at the same angle after being modified by penetration into the first layer 11 and substrate 1, the medium through which the light passes having a complex refractive index $N_o$, the film having a refractive index $N_1$ and the substrate a refractive index $N_2$.

The method requires measurements to be made at short intervals to determine the direction of travel in the $\rho$ plane. From the value of $\phi$ obtained from successive measurements of $\rho$, the allow composition can be determined. For example for the alloy $Cd_xHg_{1-x}Te$ the ideal value of $\phi$ may be calculated in advance: let it be called $\phi_i$.

Figure 4:
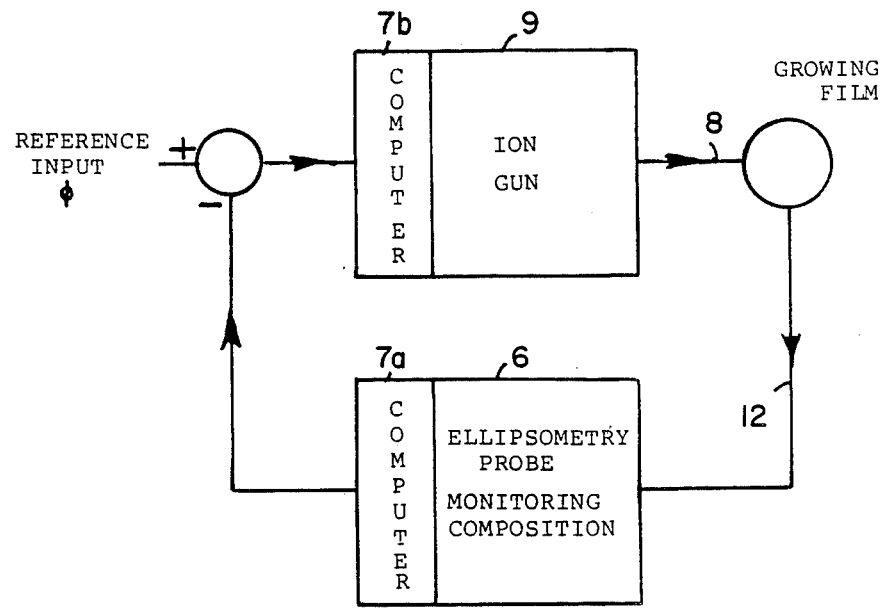
FIG. 4 is a block diagram showing the closed circuit arrangement of the ellipsometry probe used to control the correction beam which is directed to the growing film.

When the value of $\phi$ is compared with $\phi_i$, it can be seen in the $\rho$ plane whether the most recent growth has followed a spiral centred on the required value of x (ie $\phi = \phi_i$) or if it is following a recovery spiral centred further towards the x=0 and of the locus or the x=1 end of the locus. This indicates whether x is too large or too small. Closed loop control may be obtained using the arrangement shown in FIG. 4 in which the ion corrector beam 8 is directed by the ion gun 9 to the growing film 11 on the substrate 1 and is controlled in value by the computer section 7a through the beam from the ellipsometry probe, which is passed by the detector 6 to the computer section 7b, the ellipsometry beam thus controlling the corrector beam 8.

Figure 5B:
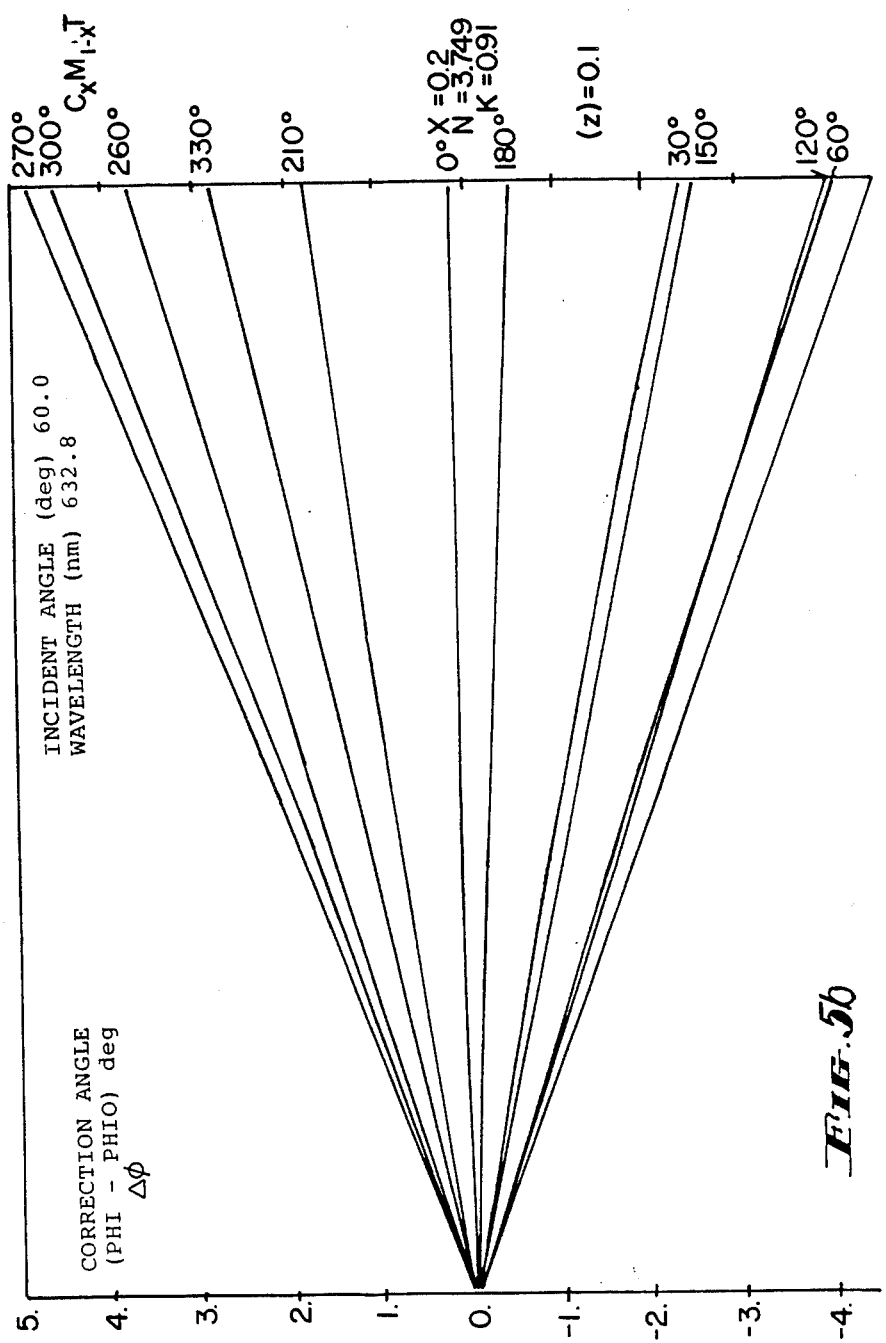

If the substrate on which the alloy film is to be grown is represented in the $\rho$ plane as a point well removed from the final equilibrium value of $\rho$ for the film to be grown, then the first approximation of the value of $\phi_i$ referred to above may be improved by adding to arg $$\left[\frac{2\pi}{\lambda}(N_1^2 - N_0^2\theta_0)^{\frac{1}{2}}\right] + \frac{\pi}{2}$$

a correction $\Delta\phi$, where $\Delta\phi$ may be calculated from a 3 phase model of reflectivity. For the case of $Cd_xHg_{1-x}Te$ values of $\Delta\phi$ for various values of (b) and $\theta$ are shown in FIG. 5. The value of $\theta$ is here, the arg (b).

The method is suitable for control of compound composition, for superlattices and for compound films with graded composition both spatially in the substrate plane and also in the direction normal to the substrate plane.

The claims defining the invention are as follows:

1. Apparatus for controlling uniformity of a growing alloy film comprising: (a) deposition means for directing at least one molecular beam onto a surface to grow a film on said surface; (b) a uniformity measurement probe comprising a light source directed to a substrate on which a film is to be grown and a detector to receive a signal from the light source reflected by the growing film, (c) a corrector gun adapted to direct a corrector beam onto the said growing film, (d) means to cause at least the said detector and the corrector beam to be correlated to scan the growing film, and (e) computer means to control the corrector beam from the signal received by the detector.

2. The apparatus according to claim 1 wherein the uniformity measurement probe is an ellipsometry probe arranged to measure the direction of travel of a locus in the $\rho$ plane to produce a signal for control of the corrector beam whereby to control the uniformity of the film.

3. The apparatus according to claim 2 comprising a closed circuit corrector arrangement comprising said gun connected to a first computer section to be controlled thereby, and a second computer section connected to said ellipsometry probe and coupled to the said first computer section to control the corrector beam from the said reflected signal.

4. The apparatus according to claim 1 wherein the uniformity probe comprises a 2 photon reflectivity probe directed to the substrate and containing a detector coupled to the computer whereby to control the corrector beam.

5. The apparatus according to claim 4 wherein the said 2 photon reflectivity probe is connected to be used in conjunction with the ellipsometry probe.

6. The apparatus according to claim 1 wherein a plurality of said deposition means is provided and arranged to direct low energy ion beams to the substrate and said corrector gun is suitable to deposit an ion species similar to the ion species of one of said deposition sources.

7. The apparatus according to claim 6 wherein a plurality of said corrector guns is provided and disposed to selectively deposit ion species corresponding to at least two of the deposition sources.

* * * * *